US006438148B1

(12) United States Patent
Hui et al.

(10) Patent No.: US 6,438,148 B1
(45) Date of Patent: Aug. 20, 2002

(54) METHOD AND DEVICE FOR ENCODING DATA INTO HIGH SPEED OPTICAL TRAIN

(75) Inventors: Rongqing R. Hui, Lenexa, KS (US); Jin J. Hong, Cupertino, CA (US); Maurice S. O'Sullivan, Ottawa (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/405,119

(22) Filed: Sep. 27, 1999

Related U.S. Application Data

(63) Continuation-in-part of application No. 09/213,088, filed on Dec. 15, 1998.
(51) Int. Cl.[7] .............................. H01S 3/10; H01S 5/00; H04B 10/00
(52) U.S. Cl. ............................ 372/22; 372/30; 372/43; 359/158
(58) Field of Search ............................... 372/22, 30, 43, 372/184, 158; 359/184, 158, 183

(56) References Cited

U.S. PATENT DOCUMENTS

| 5,521,738 A | * | 5/1996 | Froberg et al. ............. 359/184 |
| 5,548,433 A | * | 8/1996 | Smith .......................... 359/158 |

FOREIGN PATENT DOCUMENTS

| DE | 195 13 198 A | 10/1996 |
| WO | WO 98/10544 A | 3/1998 |

OTHER PUBLICATIONS

Lima C R et al: "Compact Optical Millimeter–Wave Source Using a Dual–Mode Semiconductor Laser" Electronic Letters, GB, IEE Steveange, vol. 31, No. 5, Mar. 2, 1995, pp. 364–365, XP000498180 ISSN: 0013–5194.

(List continued on next page.)

Primary Examiner—Paul Ip
Assistant Examiner—Armando Rodriguez
(74) Attorney, Agent, or Firm—Foley & Lardner

(57) ABSTRACT

A device for encoding data into high speed optical train includes N data encoding branches, each having a dual-mode laser, generating at the beat frequency f, and an external modulator. Each dual mode laser includes a laser structure having two sections formed on the same substrate which simultaneously operate at different longitudinal modes. Each section has a complex coupled (gain-coupled or loss-coupled) grating which is formed by deep etching through the multi-quantum well structure, ensuring no substantial interaction between lasers. The sections have common active medium and shared optical path and provide mutual light injection into each other. Signals from the branches are put through a variable delay line, introducing phase shifts between the signals, and compressed in the optical compressor. Thus, N short pulse optical trains are formed. The phase shifts between the signals are adjusted so that, when the trains are further combined in the optical combiner, they interleave in a precise timing to form one combined optical pulse train of frequency Nf. Thus, encoding of data at a speed, which is much higher than the speed of the external modulator, is achieved. The corresponding method of encoding data is also provided.

29 Claims, 7 Drawing Sheets

OTHER PUBLICATIONS

DE 195 13 198 A (Hertz Inst Heinrich) Oct. 2, 1996 col. 4, line 36—col. 5, line 56; figure 2.

WO 98 19544 A (Ericsson Telefon AB L M) Mar. 12, 1998, p. 5, line 2—p. 6, line 10: figure;1.

Wake, D., et al, "Optical Generation of Millimeter–Wave Signals for Fiber–Radio Systems Using a Dual–Mode DFB Semiconductor Laser", IEEE Transactions in Microwave Theory and Techniques, 43 (1995), Sep., No. 9, Part 2, pp. 2270–2276.

Lima, C.R., et al, "Compact Optical Millimetre–Wave Source Using a Dual–Mode Semiconductor Laser", Electronics Letters, Mar. 2, 1995, vol. 31, No. 5, pp. 364–366.

"Tunable dual–wavelength operation of a diode array with an external grating–loaded cavity", Wang et al., *Appl. Phys. Lett.* 64 (23), Jun. 6, 1994, pp. 3089–3091.

"Multiple Channel Signal Gerneration Using a Multichannel Grating Cavity Laser With Crosstalk Compensation", Nyairo et al., *Electronics Letters,* Jan. 30, 1992, vol. 28, No. 3, pp. 261–262.

* cited by examiner

METHOD AND DEVICE FOR ENCODING DATA INTO HIGH SPEED OPTICAL TRAIN

This application is a Continuation-In-Part of Ser. No. 09/213,088 filed Dec. 15, 1998 in the name of HUI et al., and entitled, "Generation of Short Optical Pulses using Strongly Complex Coupled DFB Lasers".

FIELD OF INVENTION

The invention relates to devices and methods for encoding data into optical trains, and in particular to encoding data into short pulse soliton trains suitable for transmission of data.

BACKGROUND OF THE INVENTION

High quality continuous tunable microwave/millimeter wave radiation, generated by compact semiconductor lasers, has numerous potential applications, such as dense wavelength division multiplexing, optical short pulse generation and high-speed wireless applications. One of the ways to generate the microwave/millimeter radiation is to use the beating of the two modes of a dual-wavelength source. Most existing dual-mode semiconductor lasers use either physically separated gain sections as shown, e.g. in publication by K. O. Nyairo, I. H. White, C. J. Armistead, and P. A. Kirkby "Multiple channel signal generation using multichannel grating cavity laser with crossstalk compensation", Electron. Letters, vol. 28, pp. 261–263, 1992, or a common gain medium which is shared by the two wavelengths as shown, e.g. in publication by C. L. Wang and C. L. Pan "Tunable dual-wavelength operation of a diode array with an external grating-loaded cavity", Applied Physics Letters, vol. 64, pp. 3089–3091, 1994.

Although dual-mode lasers are capable of generating ultra-high beat frequencies of up to several THz, a major challenge is how to encode information data into the optical train. Up to date, the most reliable way of encoding data into fiber optics systems is to use high speed modulators, with electro-optic (EO) modulators being the most common choice. However, the maximum modulation bandwidth of state-of-the-art electro-optic modulators is currently limited to approximately 50 Gb/s. It means that soliton trains having higher repetition rates can not be handled by existing types of modulators. As a result, the speed of data transmission is unavoidably limited, restricting performance of optical transmission systems.

Accordingly, there is a need in the industry for practical and reliable devices and methods for encoding data into high speed optical trains, which would allow to utilize existing types of modulators without limiting speeds of data transmission while being upgradable as the advances in the modulator technology occur.

SUMMARY OF THE INVENTION

It is an object of the present invention to provide a method and device for encoding data into a high speed optical train which would avoid the afore-mentioned problems.

Thus, according to one aspect of the present invention there is provided a device for encoding data into high speed optical train, comprising:

means for forming N short pulse optical trains, each of frequency f, carrying encoded data;

means for providing phase shifts between said N trains so as, when the trains are combined, to form one combined optical pulse train of frequency Nf;

means for combining said N trains into said combined optical train.

Preferably, the means for forming N short pulse trains further comprises N data encoding branches, each branch including:

a dual mode laser generating a signal at frequency f defined by the beat frequency between the dual modes;

an optical compressor disposed to receive the laser signal and to compress the duration thereof to form the short pulse train; and encoding means providing that required data is encoded into the train.

Conveniently, the means for providing phase shifts between said N trains comprises:

means for subharmonic modulation of each laser at frequency f/n, wherein n is an integer, to provide phase locking;

variable delay lines disposed to introduce said phase shifts between the signals.

Advantageously, the means for providing phase shifts further comprises a feedback means for sending control signals to the variable delay lines to adjust the phase shifts so as to ensure that N optical trains interleave in a precise timing.

Preferably, the encoding means is disposed so as to encode data into the laser signal before the signal is compressed in the optical compressor. Alternatively, it may be disposed so as to encode data into the laser signal after the signal is compressed in the optical compressor. The former arrangement has a potential advantage of allowing integration of the encoding means with dual mode lasers into a compact packaging. The means for providing phase shifts between the laser branches may be disposed to provide one of the following configurations: to be disposed so as to introduce phase shifts between the laser signals before encoding and before compressing the signals; or to introduce the phase shifts after encoding and before compressing the signals; or to introduce the phase shifts after compressing the signals and before encoding them with data; or to introduce the phase shifts between the signals after compressing after encoding the signals. Conveniently, the variable delay lines are disposed so as to receive the subharmonically modulated signals. Alternatively, it may be arranged that the means for subharmonic modulation receive laser signals after they are put through the variable delay lines.

Preferably, the dual mode laser is a DFB laser. To provide high quality of dual-mode operation, the dual mode laser comprises first and second DFB sections including one of the gain coupled and loss coupled DFB lasers. The active medium of the DFB laser includes a multiple quantum well structure. The first and second sections include first and second gratings correspondingly, the gratings being formed by etching grooves directly through the multiple quantum well structure. Each grating has a period comprising a first portion and a second portion, with substantially all quantum wells being etched away from the second portion, thus providing no substantial photon emission in the second portion and ensuring no substantial interaction between the laser sections.

Advantageously, the beat frequency f is from about several tens GHz to about several hundred GHz. Depending on the system requirements and the available frequency bandwidth of EO modulators, it may be narrowed to the range from about 20 GHz to about 80 GHz. The duration of pulses in pulse trains is preferably within a range from sub picoseconds to picoseconds.

Preferably, the optical compressor comprises an erbium doped fiber amplifier, followed by a piece of fiber, e.g. dispersion decreasing fiber, dispersion shifted fiber, single mode fiber, or combination thereof.

Conveniently, the encoding means comprises an external modulator. Preferably, the modulator is an electro-optical modulator, e.g. Mach-Zehnder modulator or travelling wave modulator. Conveniently, the means for combining the trains comprises fiber coupler, and the feedback means comprises a narrow bandwidth photodiode and a narrow band electrical amplifier centralized at frequency Nf.

The device may include required number of laser branches, e.g. two, three, four to ten, or any other reasonable number of lasers capable of being combined into one optical train at a required accuracy.

According to another aspect of the invention, there is provided a method for encoding data into high speed optical train, comprising the steps of:

forming N short pulse optical trains, each of frequency f, carrying encoded data;

providing phase shifts between said N trains so as, when the trains are combined, to form one combined optical pulse train of frequency Nf;

combining said N trains into said combined optical train.

Preferably, the step of forming N short pulse trains comprises the step of forming each of the N trains which includes:

providing a dual mode laser generating a signal at frequency f defined by the beat frequency between the dual modes;

compressing the signal in the optical compressor to form the short pulse train; and providing that required data is encoded into the train.

Advantageously, the step of providing phase shifts between said N trains comprises:

modulating each laser at frequency f/n, which is subharmonic to the beat frequency, to provide phase locking;

forming variable delay lines disposed to introduce said phase shifts between the signals.

Conveniently, the step of providing phase shifts further comprises providing feedback by sending feedback signals to the variable delay lines to adjust the phase shifts so as to ensure that N optical trains interleave in a precise timing. The step of providing that the data is encoded into the train may comprises encoding data into the laser signals before the step of compressing, or alternatively encoding data into the train after the step of compressing.

The method and device described above have the following advantages. Since the separation between the modes in the dual-mode laser can be made within a large range, the optical system employing such data-encoding device is, therefore, very flexible and versatile. Additionally, it can be easily upgraded to a higher bitrate system without the need to modify the system architecture, being largely depending on the available bandwidth of existing modulators and the number of the modulators used. The invented device can be successfully used in tera-bit time domain multiplexed systems (TDM) in optical fibers.

BRIEF DESCRIPTION OF THE DRAWINGS

The invention will now be described in greater detail regarding the attached drawings in which.

DESCRIPTION OF THE PREFERRED EMBODIMENTS

Figure 1:
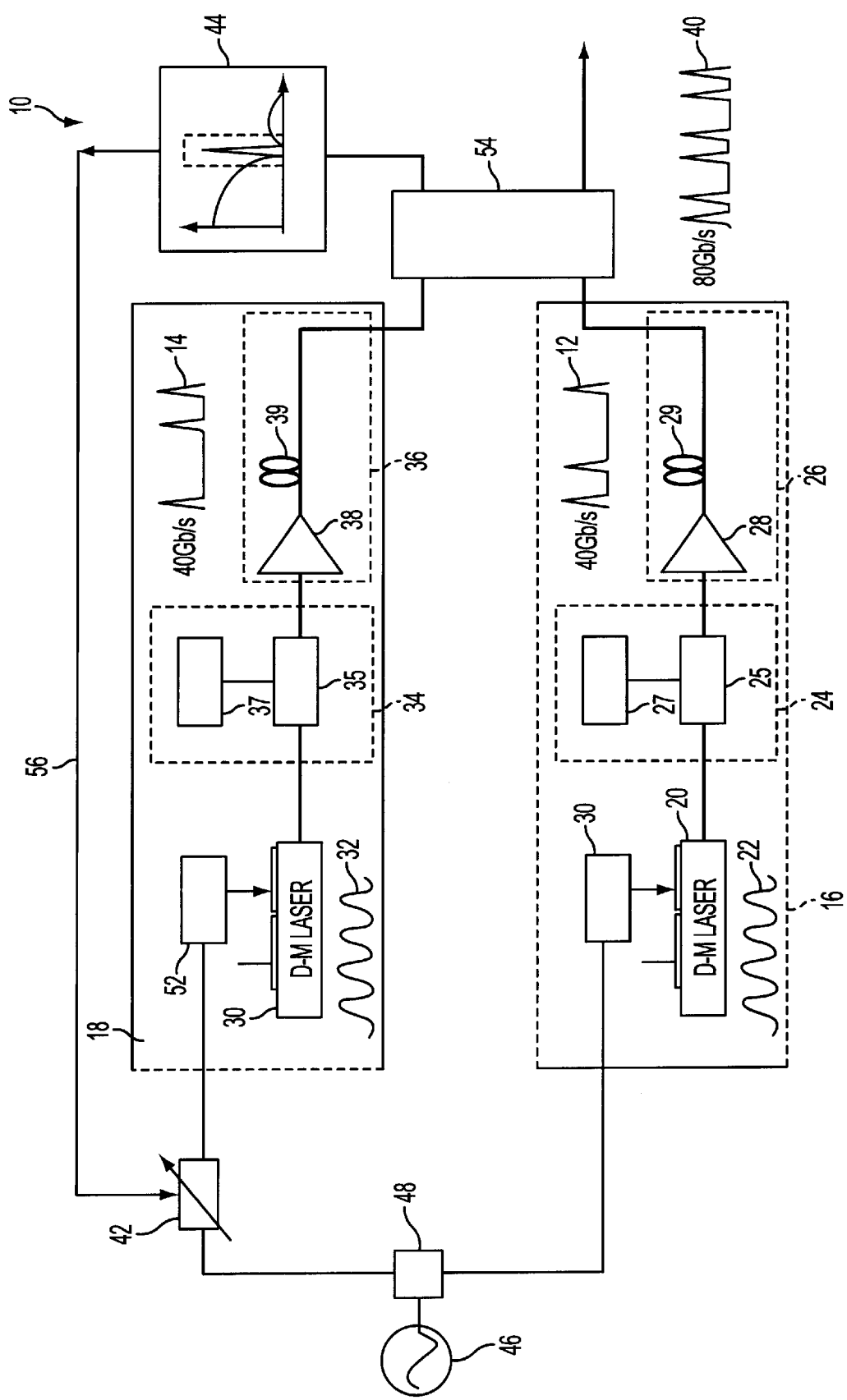
FIG. 1 shows a block diagram of a device for encoding data into high speed optical stream according to an embodiment of the invention.

A device 10 for encoding data into high speed optical train according to the embodiment of the invention is shown in FIG. 1. It comprises means for forming first and second short pulse optical trains 12 and 14 carrying encoded data at frequency f, the means including first and second data encoding branches 16 and 18 respectively where the trains 12 and 14 are formed. The first branch 16 includes a first dual mode laser 20 generating a sinusoidal signal 22 at frequency f determined by the beat frequency between the dual modes, first encoding means 24 for encoding data into the laser signal, and a first optical compressor 26 to compress the signal 22 into the first pulse train 12. The second data encoding branch is same as the first branch and correspondingly includes a second dual mode laser 30 generating a beat signal 32, second encoding means 34, and a second optical compressor 36 to compress the signal 32 into the second pulse train 14.

Each dual-mode laser operates at a beat frequency of f=40 GHz (with a typical range of frequencies f being from 20 GHz to 100 GHz), thus determining the speed requirement for data-encoding means of 40 Gbs/s as well. First and second data-encoding means 24 and 34 respectively include a first electro-optical modulator 25 driven by the first data source 27, and a second electro-optical modulator 35 driven by the second data source 37. The first optical compressor 26 includes a first erbium-doped optical fiber amplifier (EDFA) 28 pumped at 980 nm followed by fiber 29 composed of a piece of dispersion shifted fiber (DSF) 4 km long and a piece of a standard single mode fiber (SMF) 1 km long. The DSF is subjected to high optical powers and has high efficiency of providing self-phase modulation, while the SMF, placed after the DSF, uses this nonlinear self-phase modulation generated in the previous fiber section to compress the optical pulse. The second optical compressor 36 has the same structure as the first compressor 26 described above and includes a second EDFA 48 followed by fiber 39.

It is intended to combine two information carrying soliton trains 12 and 14, each operating at f=40 GHz and encoded with data at 40 Gb/s respectively, into one combined short pulse optical train 40 of doubled frequency f=80 GHz and carrying information at 80 Gb/s. To do this, means for providing phase shifts between trains 12 and 14 are introduced, including means for subharmonic modulation of lasers 20 and 30, a variable delay line 42 and a feedback means 44. The means for subharmonic modulation comprises a master microwave source 46 oscillating at frequency f/n, (where n is an integer number), whose signal is split in a microwave beam splitter 48 and sent via corresponding bias-tees 50 and 52 to one of the electrodes of each of dual-mode lasers 20 and 30 respectively to achieve subharmonic modulation of the laser beat frequency f. Such a subharmonic modulation provides frequency stabilization and phase locking of the beat signals for lasers 20 and 30, effectively reducing frequency jitter and phase noise of the beat signals. The variable delay line 42, by way of example placed into the second branch 18, is used to introduce predetermined relative phase shift between the signals generated by lasers 20 and 30 so as, when the trains 12 and 14 are further combined in an optical combiner 54, to interleave and form one combined optical pulse train 40 of frequency 2f. The optical combiner 54 is a 3 dB fiber coupler providing the multiplexing of two trains 12 and 14. The feedback means 44 is used to provide an active control of the relative phase shift between the branches 16 and 18. It includes narrow bandwidth photodiode and electrical k amplifier (none of them is shown), the amplifier being centralized at frequency 2f. The feedback means 44 extracts the information about the current phase alignment between the two branches and generates a feedback signal 56 sent to the variable delay line 42, which is a voltage controlled microwave delay line, to adjust the phase shift between the lasers 20 and 30 and to ensure that the trains 12 and 14 interleave in precise timing. Since soliton bit trains 12 and 14 are in the return-to-zero (RZ) format, and a distinct feature of RZ signal spectrum is that it has a characteristic peak at the pulse repetition rate, it means that when the two tributary soliton trains 12 and 14 are aligned precisely in timing, the characteristic frequency peak at 2f reaches its highest level. Therefore, the measure of the energy at frequency 2f indicates the quality of train alignment, and this information is used to control the variable microwave delay line 42.

Figure 2:
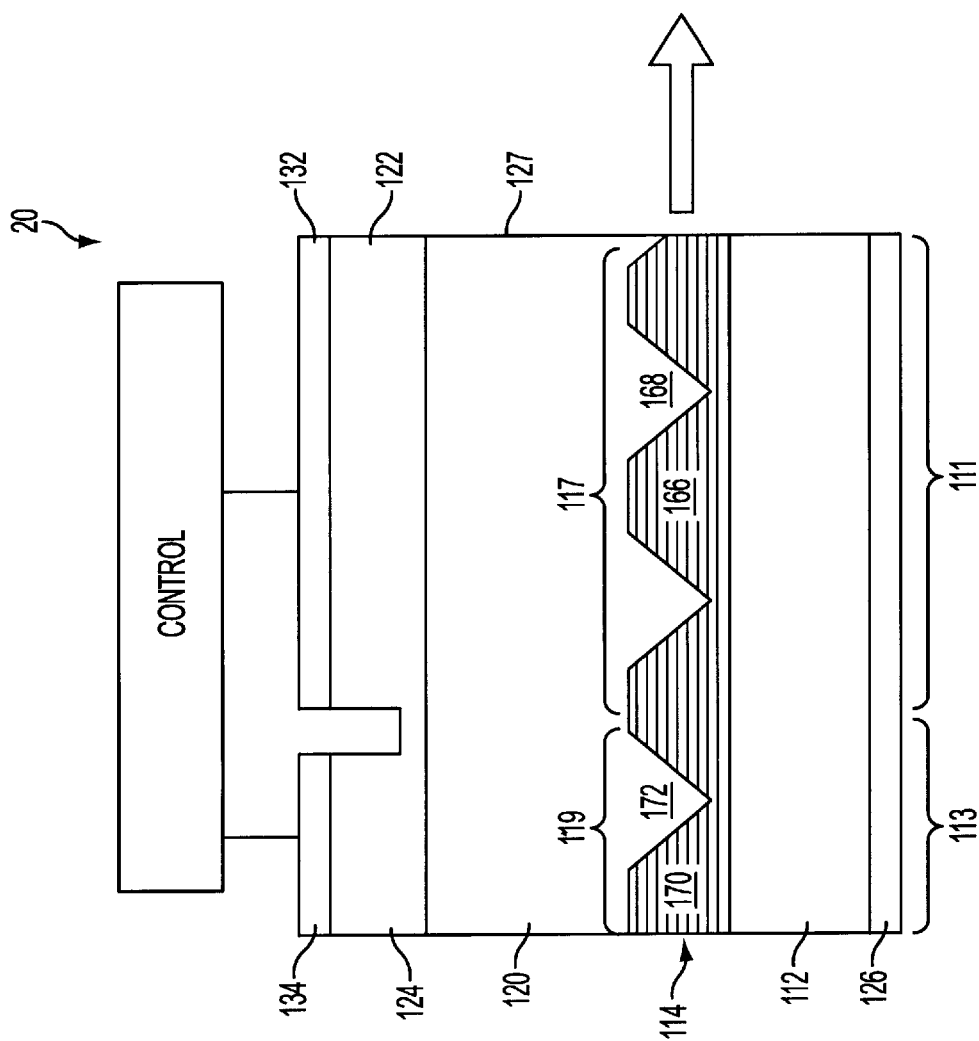
FIG. 2 shows a schematic cross sectional view of a dual-mode laser incorporated into the device of FIG. 1.

Lasers 20 and 30 have same structure and operation. By way of example, a schematic cross section through the dual-mode laser 20 is shown in FIG. 2. The laser 20 comprises a first gain coupled DFB section 111 and a second gain coupled DFB section 113 having their cavities arranged coaxially along same optical axis, designated by a numeral I—I in FIG. 2. Sections 111 and 113 have outputs arranged along the line I—I and in the. same direction shown by an arrow on the line I—I, the first section 111 being closer to an output facet 127. The laser 20 is formed on a substrate 112 providing a first confinement region, an active medium 114 comprising a multiple quantum well structure 116 and a first and second uniform gratings 117 and 119 defined therein, and an overlying confinement region 120. Means for excitation the first and second sections are formed thereon, and include a contact to the substrate 126, first and second current confining ridges 122 and 124, first and second contact electrodes 130 and 132 being defined on each ridge respectively for current injection into the laser structure. The first and second gratings 117 and 119 positionally correspond to the first and second sections 111 and 113 respectively. The gratings have same grating periods, and sections 111 and 113 have different lengths so that they will behave differently in lasing operation. For example, for the laser shown in FIG. 2, the first section is 150 micrometers long and the second section is 550 micrometers long. The sections provide dual-mode operation, i.e. each laser provides a stable generation at its own frequency/wavelength in the presence of another laser. It is arranged that sections 111 and 113 generate at different sides of a DFB stopband, e.g. section 111 generates at the left Bragg mode of the stopband, while section 113 generates at the right Bragg mode of the stopband. Therefore the wavelength/frequency spacing between sections is determined by the stopband width. The sections 111 and 113 have a common active medium 114 and shared optical path to the output facet 127 and provide mutual injection of light into each other. Due to the mutual light injection, a sinusoidal optical beat signal is generated by the laser 20, with the frequency spacing defined by the wavelength spacing between the two stable operated modes. The frequency spacing is fine tuned to the specific frequency spacing required in the system by current injection into the sections 111 and 113. The beat signals 22 and 32 are sources of tunable radiation having a typical wavelength within a microwave to millimeter range.

Both gratings 117 and 119 are made by periodic etching grooves through the active medium 114, the depth of etching being defined so as to provide a substantial insensitivity of each laser to the external feedback and random facet variations and thereby ensuring no substantial interaction between the sections.

Figure 3:
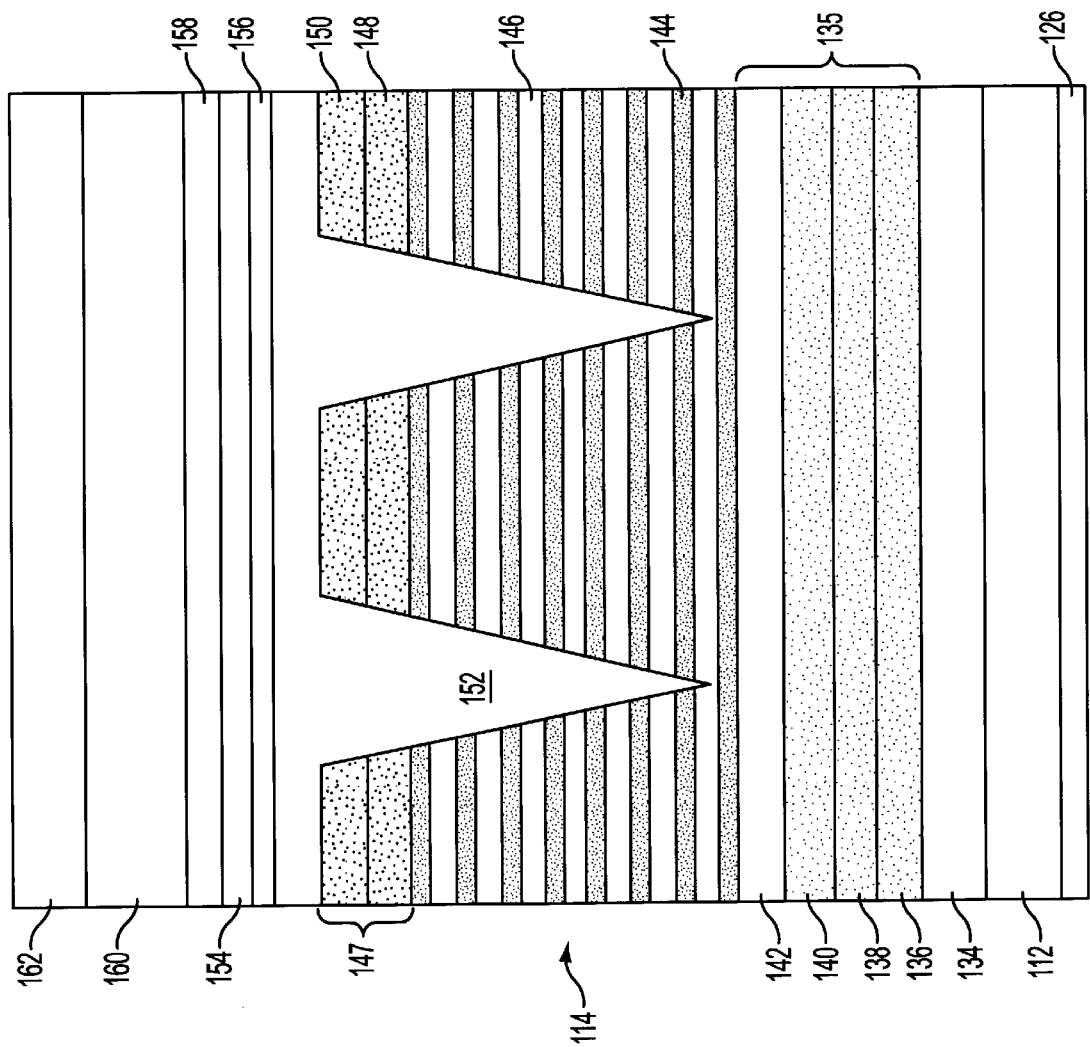
FIG. 3 shows a detailed cross sectional view of the laser of FIG. 2.

The structure of the sections 111 and 113 forming the laser 20 is shown in more detail in FIG. 3, which illustrates an oblique cross-sectional view through the laser 20. The DFB semiconductor laser 20 is fabricated from Group III–V semiconductor materials, and comprises a heavily N-doped InP substrate 112, on which an N-doped InP buffer layer 134 of 1.5 $\mu$m thickness is defined. The first separate confinement region 135, consisting of four confinement layers 136, 138, 140 and 142 of N-doped InGaAsP with energy band gaps corresponding to wavelengths of 1.0 $\mu$m. 1.1 $\mu$m, 1.15 $\mu$m and 1.20 $\mu$m respectively, is provided over the buffer layer 134. The thickness of each confinement layer is 20 nm, and the confinement layer 136 corresponding to the 1.0 $\mu$m wavelength is adjacent to the buffer layer 134. The active region 114 overlies the confinement region 135 and comprises a multiple quantum well (MQW) structure 116 which includes four to eight 1% compressively strained N-doped, or undoped InGaAsP quantum wells 144, each being 5 nm thick, separated by several undoped or P-doped InGaAsP unstrained barriers 146 with a band gap corresponding to wavelength of 1.20 $\mu$m, each barrier being 10 nm thick. The alloy composition and layer thickness of the MQW structure 116 are tailored to have specific band gap energies to provide for lasing at a required wavelength. Increasing the number of quantum wells provides higher gain per unit length of the laser cavity. The band gap of the quantum well structure described above provides a lasing wavelength of the device at about 1.55 $\mu$m. A second separate confinement region 147, consisting of two P-doped InGaAsP confinement layers 148 and 150, having energy band gaps corresponding to 1.1 $\mu$m and 1.20 $\mu$m wavelengths respectively, is grown on top of the MQW active region 114, each layer being 20 nm thick.

As mentioned above, gratings 117 and 119 are defined by periodically etched grooves through the active medium 114. The pitch of the groove of each grating is selected so as to define a first order grating for the lasing Bragg wavelength. Grating 117 has a period comprising a first portion 166 and a second portion 168 as shown in FIG. 2. Grating 119 has corresponding first and second portions 170 and 172. Second portions 168 and 172 in the respective gratings 117 and 119 are V-shaped and characterized by substantial etching away almost all quantum wells, namely, seven out of eight quantum wells in this embodiment. The more quantum wells are etched away from the portion the less is the photon generation in the section. Thus, a deep etching through the second portions 168 and 172 provides no substantial photon emission in these portions. Usually deep etching is avoided for a single laser because of the accompanied strong index coupling. For the series of DFB lasers, deep etching provides substantially independent generation of each section in the series and no substantial interaction between sections as will be described below.

A P-doped InP layer 152, fills the grooves of the gratings. A 3 nm thick etch stop layer 154 of P-doped InGaAsP, surrounded by P-doped InP buffer layer 156 at the bottom and P-doped InP buffer layer 158 at the top is formed next, the buffer layers being 100 nm and 200 nm thick correspondingly. An upper cladding layer 160 of P-type InP, followed by a highly doped P-type capping layer 162 of InGaAs for contact enhancement, having thickness 1600 nm and 200 nm correspondingly, complete the structure. The separation between the adjacent electrodes 130 and 132 is in the range of 5 to 15 $\mu$m to ensure both a sufficient electrical isolation between the adjacent electrodes and a limited material absorption loss. A bottom electrical N-contact 126 is provided at the bottom of the substrate 112. Corresponding means (not shown) for simultaneous two-wavelength generation of the lasers 111 and 113, means for controllably varying current injection and changing temperature of each laser for switching between lasing modes, preferably within a time interval of several nanoseconds, and tuning of laser wavelength of each laser around a corresponding lasing mode are provided.

Thus, the device 10 for encoding data into a high speed optical train 40 is provided.

The device 10 operates in the following manner. Dualmode lasers 20 and 30 generate sinusoidal signals 22 and 32 respectively at the beat frequency f=40 GHz between the dual modes. A microwave source 46 oscillating at frequency f/n, where n is an integer number, subharmonically modulates each of the lasers via bias tees 50 and 52, thus locking the beat frequency of each laser by the $n^{th}$ harmonic of the microwave source. Since the two lasers are modulated by the same microwave source, the output beat signals from them have a fixed phase relationship. The signals 22 and 32 from the lasers are encoded with data in data encoding means 24 and 34 respectively and sent to corresponding optical compressors 26 and 36 to compress the sinusoidal optical oscillations 22 and 32 into soliton pulse trains 12 and 14. After the pulse compression the two information carrying soliton trains 12 and 14 are time domain multiplexed by a fiber coupler 54. The tunable delay line 42 introduces the required phase shift between the lasers so as to provide interleaving of the trains in precise timing. The feedback means 44 provides an active control of the relative phase shift between the trains by sending the feedback signal 56 to the delay line 42.

Thus, the soliton pulse train 40 at double frequency 2f=80 GHz and encoded at 80 Gb/s is formed.

Figure 4:
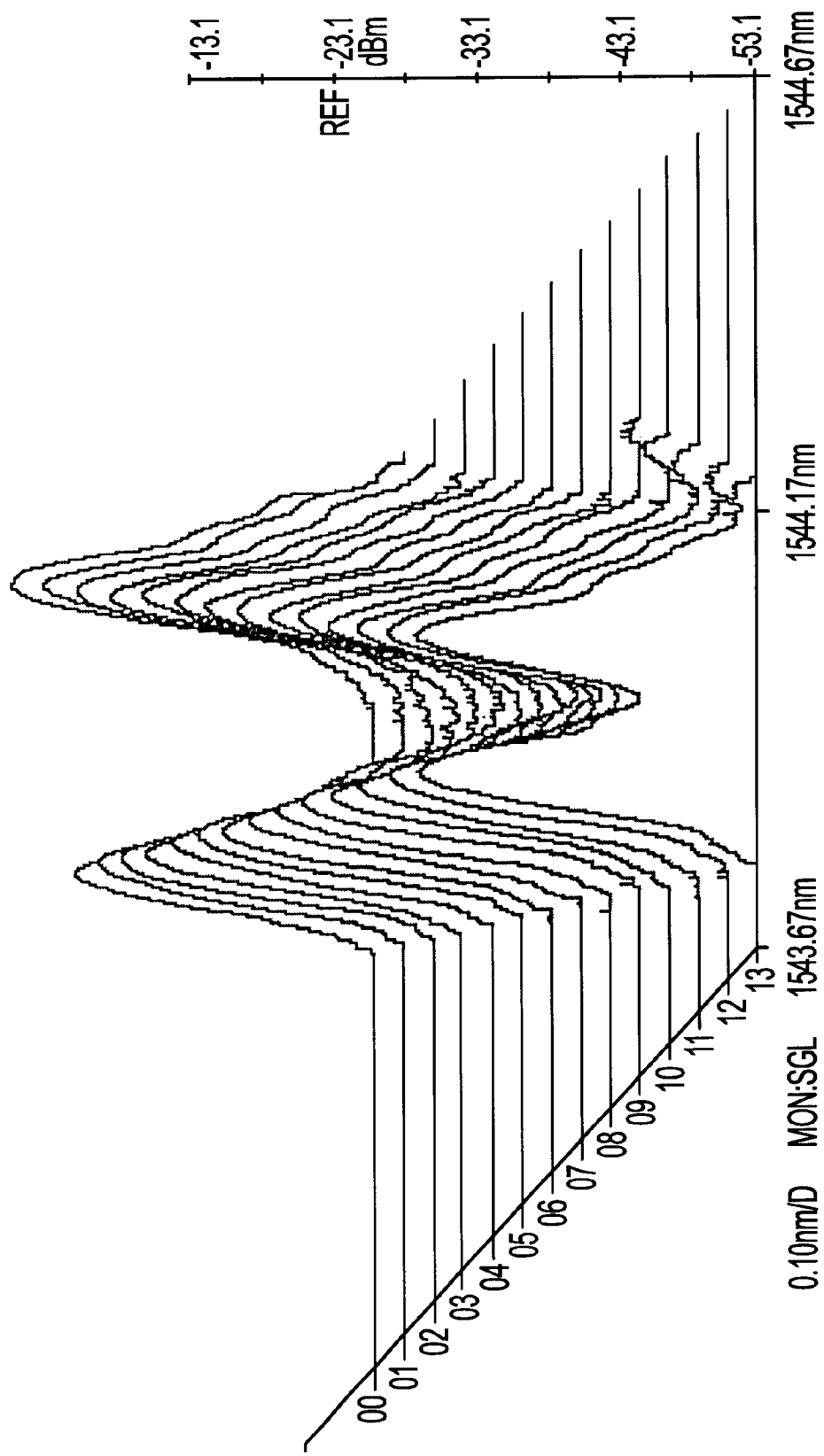
FIG. 4 shows a continuously tunable optical spectrum of the dual-mode laser of FIG. 2.
Figure 5:
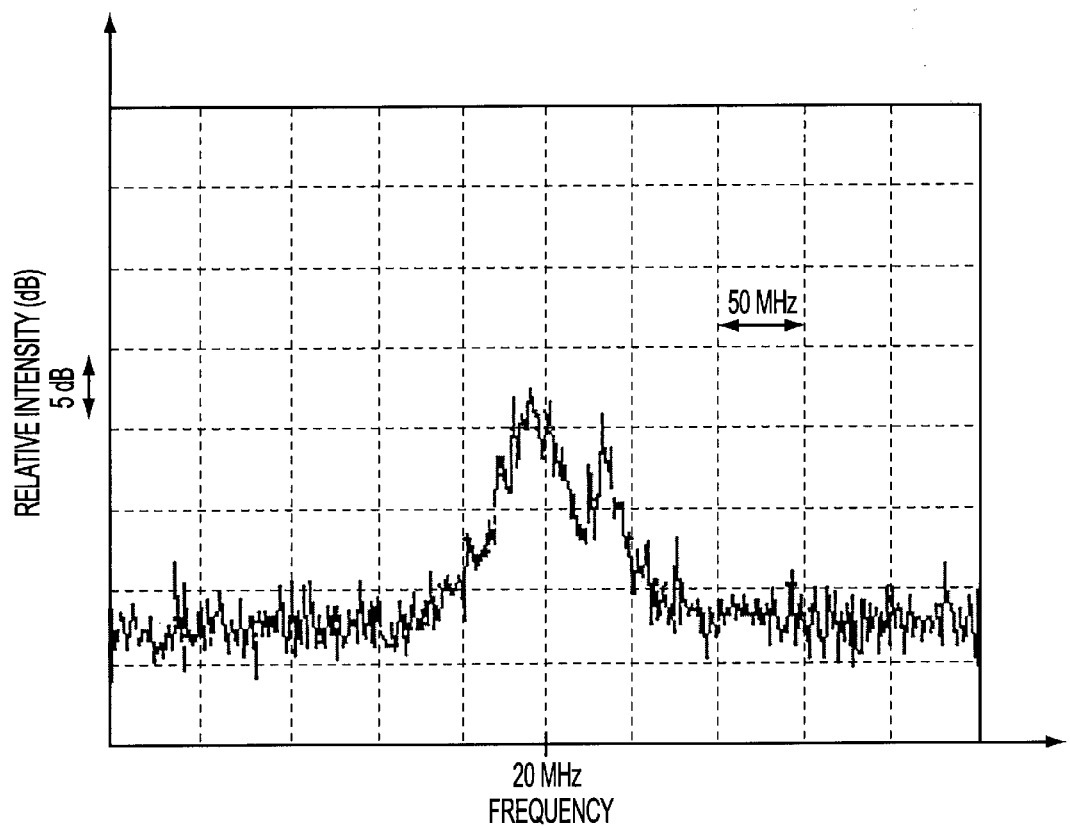
FIG. 5 shows an electrical beat spectrum around 20 GHz for the device of FIG. 2 in the absence of subharmonic injection locking.
Figure 6:
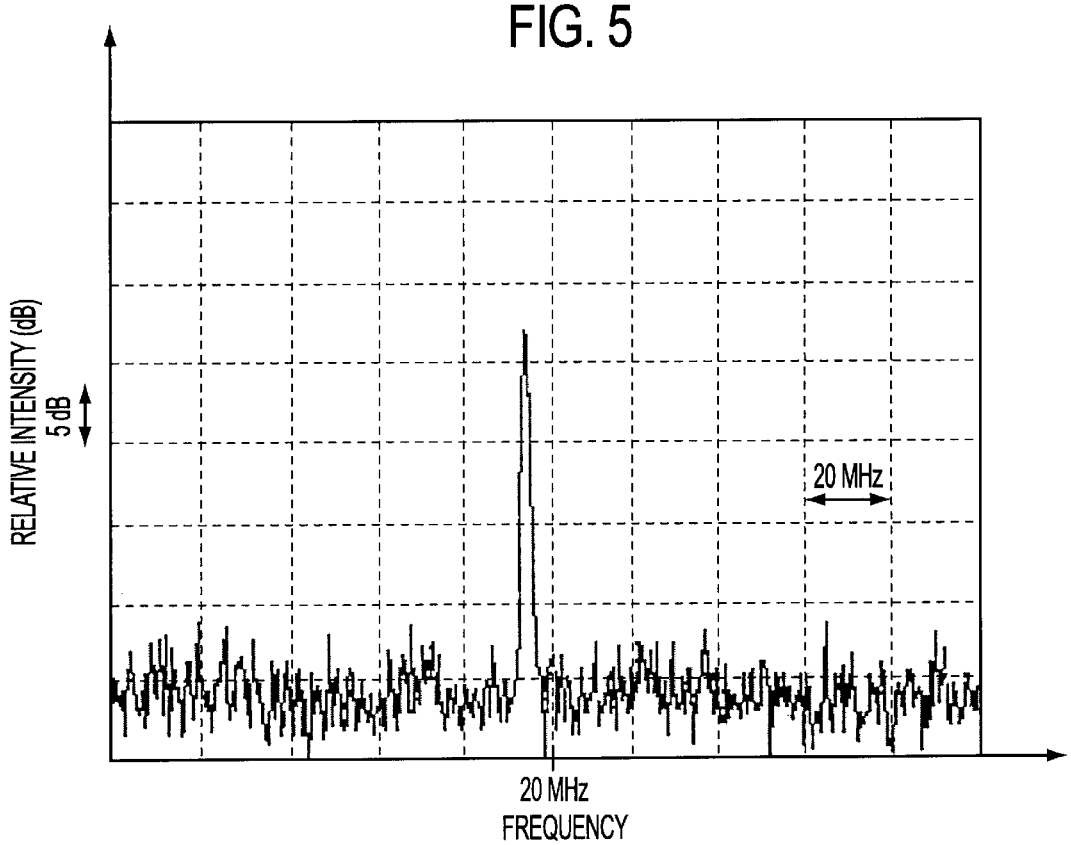
FIG. 6 shows a signal at 20 GHz which is optically injection locked by the fourth harmonic of a sinusoidal modulation at 5 GHz.
Figure 7:
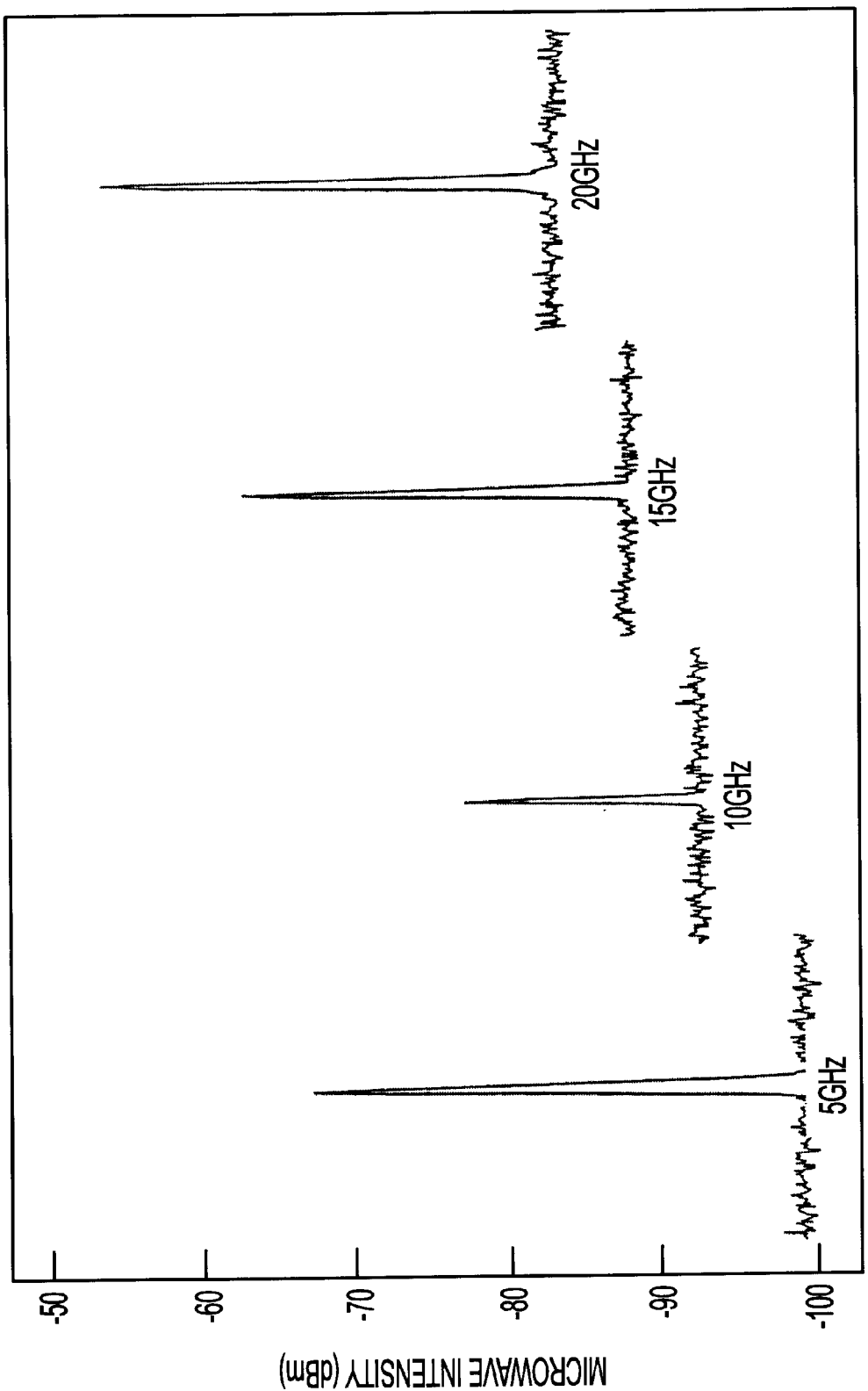
FIG. 7 shows a composite electrical spectrum including the fundamental frequency and harmonics.
Figure 8:
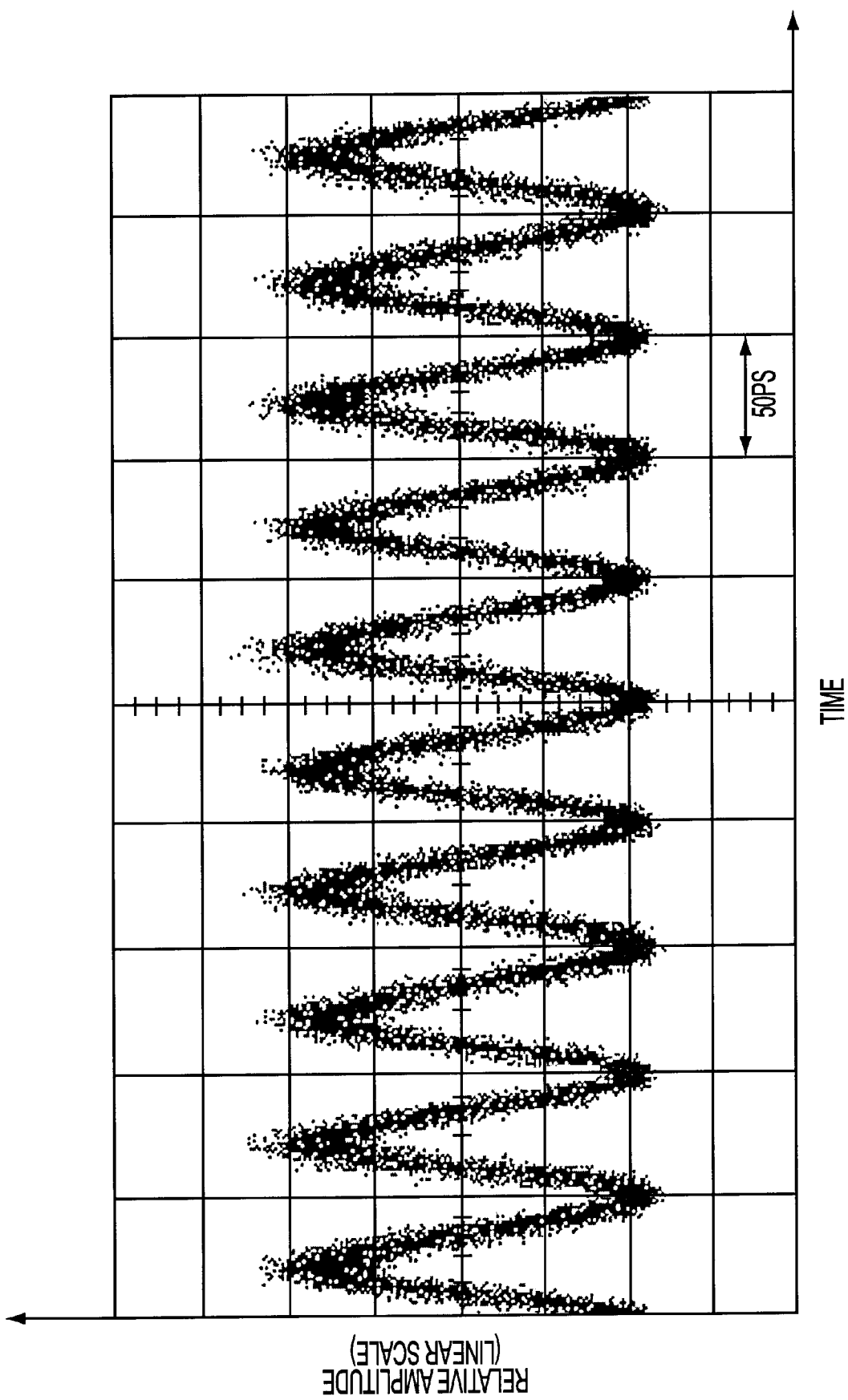
FIG. 8 shows a time domain waveform with the fourth harmonic injection locking.

Dual-wavelength operation is obtained by biasing the two laser sections well above their respective threshold currents. FIG. 4 shows a 3-dimensional plot of the optical spectrum of dual-wavelength operation, where the first section 111 is biased at 35 mA, and the second section 113 is tuned from about 70 mA to about 90 mA. As a result, the frequency spacing between the two laser modes is continuously varied from about 18 GHz to about 40 GHz. Sending this dual-mode lightwave into a high-speed photodiode, the free-running electrical spectrum of the beat signal centered at approximately 20 GHz is obtained as shown in FIG. 5. Since no special effort is made for the temperature control and optical isolation, the beat frequency is not stable. The linewidth is in the range of several MHz. When a 5 GHz radio frequency (RF) signal having power of +9 dBm from the microwave source 46 is used to modulate the first laser section 111, the 20 GHz beat signal becomes optically injection locked by the fourth harmonic of the modulation. As shown in FIG. 6, the beat frequency is stabilized by the injection locking, and the linewidth is measured to be less than 30 Hz, being limited by the stability of the microwave source 46 used and the resolution of the spectrum analyzer. The composite electrical spectrum is shown in FIG. 7, where both the fundamental frequency and the harmonics are shown. It is noted that the fourth harmonic of the signal is the strongest, which indicates that the injection locking is quite efficient. Since the injection locked harmonic at the optical beat frequency is much stronger than the fundamental one, a special microwave filter may not be required to use the locked frequency. In order to verify this, the time domain waveform is measured as shown in FIG. 8. Apart from the thermal noise of photo detection, it is seen that the time domain response is close to a perfect sinusoidal function, which is stable with little amplitude modulation. This indicates that both the phase noise and time jitter have been significantly reduced, which is important for high bit-rate optical systems. It is worth mentioning that even though we have demonstrated the optical injection locking of one laser, the same master microwave source can simultaneously lock a number of dual-mode lasers in the same way. The beat frequency and phase of every laser in the system is thus synchronized with each other, thus ensuring the stability of their interleaving.

While the device 10 of the embodiment described above has two branches 16 and 18 to combine two short pulse trains 12 and 14 of lower frequency f into one combined pulse train 40 of higher frequency 2f, the alternative embodiments of the device may include any other number of branches so as to provide corresponding combining of N optical trains of frequency f into one optical train of frequency Nf. The maximum number of branches is determined by the required parameters for the device such as the combined frequency Nf, the speed of individual optical modulators, the required accuracy for combining the trains in precise timing. Additionally, having N branches would require N−1 delay lines introduced into N−1 branches to provide corresponding phase shifts between the trains.

Additional modifications to the device 10 may include substitution of dual-mode DFB lasers having etched through gratings by other known types of lasers which would provide stable operation at the beat frequency. The encoding means 24 and 34 may include electro-optical modulators or other known types of modulators providing the required speed of operation. Preferably, the modulators are electro-absorptive, LiNbO$_3$ or III–V semiconductor material based devices, either Mach-Zehnder or travelling wave type.

In the embodiment described above, the encoding means are disposed so as to encode data into the laser signals before they are compressed in optical compressors. Alternatively, it may be arranged that the data is encoded after compression. The former approach has the following advantages. Encoding data before pulse compression may allow integration of electro-optical modulators together with lasers which would simplify hardware configuration and make the whole device more stable. Another advantage of encoding data before pulse compression is that in this way, the power efficiency of nonlinear pulse compression is 3-dB higher than encoding data after pulse compression. The reason is that after data encoding (on/off key), 50% of the peaks are removed statistically from the periodical waveform and therefore, for a certain average optical power at the fiber amplifier output, the pulse peak power is enhanced by 3-dB.

The means for providing phase shifts between the laser branches may be disposed to provide one of the following configurations: to be disposed so as to introduce phase shifts between the laser signals before encoding and before compressing the signals; or to introduce the phase shifts after encoding and before compressing the signals; or to introduce the phase shifts after compressing the signals and before encoding them with data; or to introduce the phase shifts between the signals after compressing after encoding the signals. Conveniently, the variable delay lines are disposed so as to receive the subharmonically modulated signals. Alternatively, it may be arranged that the means for subharmonic modulation receive laser signals after they are put through the variable delay lines.

Advantageously, the beat frequency f is in the range from about several tens GHz to about several hundred GHz. The duration of pulses in pulse trains is preferably within a range from sub picoseconds to picoseconds.

The above modifications may also include minor adjustments to the device 10 which can be easily done by a person skilled in the art.

The device 10 for encoding data into a high speed optical train has the following advantages. Firstly, by using multi-section and/or multi-grating gain coupled DFB lasers, the frequency of each pulse train may be fine tuned to the achievable speed of the existing modulators. Therefore, the device is easily upgradable to the available bandwidth of external modulators. Secondly, as mentioned above, the device may include any required number of lasers forming low frequency pulse trains, being limited only by the repetition rate, the pulse width after compression and the number of interleaved modulators used. Thirdly, a compact long-term wavelength stabilization technology, e.g. using Fabry-Perot etalons, may be additionally used to set and lock frequencies of lasers and making the whole system more stable and reliable.

Thus, it will be appreciated that, while specific embodiments of the invention are described in detail above, numerous variations, modifications and combinations of these embodiments fall within the scope of the invention as defined in the following claims.

What is claimed is:

1. A device for encoding data into high speed optical train, comprising:
    means for forming N short pulse optical trains, each of frequency f, carrying encoded data, wherein N is an integer greater than one, wherein the means for forming N short pulse trains further comprises,
    N data encoding branches, each branch comprising:
    a dual mode laser generating a signal at frequency f defined by the beat frequency between the dual modes;
    an optical compressor disposed to receive the laser signal and to compress the duration thereof to form the short pulse train; and
    encoding means for providing that required data is encoded into the pulse train;
    means for providing phase shifts between said N pulse trains so as, when the pulse trains are combined, to form one combined optical pulse train of frequency Nf;
    means for combining said N pulse trains into said combined optical pulse train.

2. A device as defined in claim 1, wherein the means for providing phase shifts between said N trains comprises:
    means for subharmonic modulation of each laser at frequency f/n, wherein n is an integer, to provide phase locking;
    variable delay lines disposed to introduce said phase shifts between the signals.

3. A device as defined in claim 2, wherein the means for providing phase shifts further comprises a feedback means for sending control signals to the variable delay lines to adjust the phase shifts so as to ensure that N optical trains interleave in a precise timing.

4. A device as defined in claim 1, wherein the encoding means is disposed so as to encode data into the laser signal before the signal is compressed in the optical compressor.

5. A device as defined in claim 1, wherein the encoding means is disposed so as to encode data into the laser signal after the signal is compressed in the optical compressor.

6. A device as defined in claim 4, it wherein the means for providing phase shifts is disposed so as to introduce phase shifts between the signals before encoding the signals and before compressing the signals.

7. A device as defined in claim 4, wherein the means for providing phase shifts is disposed so as to introduce phase shifts between the signals after encoding the signals and before compressing the signals.

8. A device as defined in claim 1, wherein the means for providing phase shifts is disposed so as to introduce phase shifts between the signals after compressing the signals and before encoding the signals.

9. A device as defined in claim 1, wherein the means for providing phase shifts is disposed so as to introduce phase shifts between the signals after compressing the signals and after encoding the signals.

10. A device as defined in claim 2, wherein the variable delay lines are disposed so as to receive the subharmonically modulated signals.

11. A device as defined in claim 2, wherein the means for subharmonic modulation is disposed so as to receive laser signals after they are put through the variable delay lines.

12. A device as defined in claim 1, wherein the dual mode laser is a DFB laser.

13. A device as defined in claim 1, wherein the dual mode laser comprises first and second DFB sections each section including one of the gain coupled and loss coupled DFB lasers.

14. A device as defined in claim 12, wherein the sections have common active medium, shared optical path and provide mutual light injection into each other.

15. A device as defined in claim 14, wherein the active medium of the DFB laser includes a multiple quantum well structure.

16. A device as defined in claim 15, wherein the first and second sections include first and second gratings correspondingly, the gratings being formed by etching grooves directly through the multiple quantum well structure.

17. A device as defined in claim 16, wherein each grating has a period comprising a first portion and a second portion, with substantially all quantum wells being etched away from the second portion, thus providing no substantial photon emission in the second portion and ensuring no substantial interaction between the laser sections.

18. A device as defined in claim 1, wherein the optical compressor comprises an erbium doped fiber amplifier.

19. A device as defined in claim 18, wherein the optical compressor further comprises a fiber selected from the group consisting from dispersion decreasing fiber, dispersion shifted fiber, single mode fiber and the combination thereof.

20. A device for encoding data into high speed optical train, according to claim 1,
    wherein the means for combining N trains comprises a fiber coupler.

21. A device as defined in claim 3, wherein the feedback means comprises a narrow bandwidth photodiode and a narrow band electrical amplifier centralized at frequency Nf.

22. A device for encoding data into high speed optical train, according to claim 1, wherein N=2.

23. A device for encoding data into high speed optical train, according to claim 1, wherein N=3.

24. A device for encoding data into high speed optical train, according to claim 1, wherein N is in the range from 4 to 10.

25. A method for encoding data into high speed optical train, comprising the steps of:

forming N short pulse optical trains, each of frequency f, carrying encoded data, wherein N is an integer greater than one;

providing phase shifts between said N pulse trains so as, when the pulse trains are combined, to form one combined optical pulse train of frequency Nf;

combining said N pulse trains into said combined optical train, wherein the step of forming N short pulse trains comprises the step of forming each of the pulse trains which includes, providing a dual mode laser generating a signal at frequency f defined by the beat frequency between the dual modes;

compressing the signal in the optical compressor to form the short pulse train; and providing that required data is encoded into the train.

26. A method as defined in claim 25, wherein the step of providing phase shifts between the N trains comprises:

modulating each laser at frequency f/n, which is subharmonic to the beat frequency, to provide phase locking;

forming variable delay lines disposed to introduce said phase shifts between the signals.

27. A method as defined in claim 26, wherein the step of providing phase shifts further comprises providing feedback by sending control signals to the variable delay lines to adjust the phase shifts so as to ensure that N optical trains interleave in a precise timing.

28. A method as defined in claim 25, wherein the step of providing that the data is encoded into the train comprises encoding data into the laser signals before the step of compressing.

29. A method as defined in claim 25, wherein the step of providing that the data is encoded into the train comprises encoding data into the train after the step of compressing.

* * * * *